(12) United States Patent
Khursheed et al.

(10) Patent No.: US 8,723,114 B2
(45) Date of Patent: May 13, 2014

(54) SEQUENTIAL RADIAL MIRROR ANALYSER

(71) Applicant: National University of Singapore, Singapore (SG)

(72) Inventors: Anjam Khursheed, Singapore (SG); Hung Quang Hoang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 13/679,181

(22) Filed: Nov. 16, 2012

(65) Prior Publication Data

US 2013/0126730 A1 May 23, 2013

Related U.S. Application Data

(60) Provisional application No. 61/560,909, filed on Nov. 17, 2011.

(51) Int. Cl.
*H01J 37/26* (2006.01)
*H01J 3/26* (2006.01)
*H01J 49/48* (2006.01)
*H01J 49/44* (2006.01)

(52) U.S. Cl.
CPC ......... *H01J 49/48* (2013.01); *H01J 2237/0535* (2013.01); *H01J 2237/24485* (2013.01); *H01J 2237/05* (2013.01); *H01J 49/44* (2013.01)
USPC ........ 250/305; 250/396 R; 250/306; 250/307; 250/311

(58) Field of Classification Search
CPC ................. H01J 2237/24485; H01J 2237/053; H01J 49/48
USPC .............................................. 250/396 R, 305
See application file for complete search history.

(56) References Cited

U.S. PATENT DOCUMENTS 3,920,988 A * 11/1975 Taya et al. ..................... 250/296

(Continued)

OTHER PUBLICATIONS

M.M. El-Gomati, C.G.H. Walker, X. Zha; Towards quantitative scanning electron microscopy: Applications to nano-scale analysis; Nuclear Instruments and Methods in Physics Research; Feb. 7, 2011; pp. 68-73; A 645.

(Continued)

*Primary Examiner* — Jack Berman
*Assistant Examiner* — Kevin Chung
(74) *Attorney, Agent, or Firm* — Vic Y. Lin; Joseph G. Chu; Innovation Capital Law Group, LLP

(57) ABSTRACT

A sequential radial mirror analyzer (RMA) (100) for facilitating rotationally symmetric detection of charged particles caused by a charged beam incident on a specimen (112) is disclosed. The RMA comprises a 0V equipotential exit grid (116), and a plurality of electrodes (119, 120*a*, 120*b*, 120*c*) electrically configured to generate corresponding electrostatic fields for deflecting at least some of the charged particles of a single energy level to exit through the exit grid (116) to form a second-order focal point on a detector (106). The second-order focal point is associated with the single energy level, and the detector (106) is disposed external to the corresponding electrostatic fields. A related method is also disclosed.

17 Claims, 11 Drawing Sheets

(56) References Cited

U.S. PATENT DOCUMENTS

| | | | | |
|---|---|---|---|---|
| 3,944,827 | A | * | 3/1976 | Matsuda .................. 250/298 |
| 3,949,221 | A | * | 4/1976 | Liebl ....................... 250/281 |
| 4,126,782 | A | * | 11/1978 | Usami et al. ............... 250/305 |
| 4,135,088 | A | * | 1/1979 | Ishikawa et al. ........... 250/307 |
| 4,219,730 | A | * | 8/1980 | Ishikawa et al. ........... 250/305 |
| 4,758,722 | A | * | 7/1988 | Leckey et al. ............. 250/305 |
| 5,008,535 | A | * | 4/1991 | Van Gorkom ............. 250/305 |
| 5,563,418 | A | * | 10/1996 | Leung .................. 250/492.21 |
| 6,184,523 | B1 | * | 2/2001 | Dowben et al. ........... 250/305 |
| 6,762,408 | B1 | * | 7/2004 | Read ....................... 250/305 |
| 8,013,298 | B2 | * | 9/2011 | Khursheed ................ 250/305 |
| 2004/0084620 | A1 | * | 5/2004 | Khursheed ................ 250/310 |
| 2008/0197277 | A1 | * | 8/2008 | Nasser-Ghodsi et al. ... 250/305 |
| 2009/0200463 | A1 | * | 8/2009 | Degenhardt et al. ....... 250/307 |
| 2010/0072363 | A1 | * | 3/2010 | Giles et al. ............... 250/287 |
| 2010/0127168 | A1 | * | 5/2010 | Khursheed ................ 250/305 |
| 2011/0147585 | A1 | * | 6/2011 | Kholine et al. ............ 250/310 |
| 2011/0168886 | A1 | * | 7/2011 | Shadman et al. .......... 250/305 |

OTHER PUBLICATIONS

H. Z. Sar-El; Criterion for Comparing Analyzers; Rev. Sci. Instrum.; Oct. 16, 1968; pp. 561-564; vol. 41, No. 4; American Institute of Physics.

Sybren Sijbrandij, Bill Thompson, John Notte, Bill W. Ward, and Nicholas P. Economou; Elemental analysis with the helium ion microscope; J. Vac. Sci. Technol. B; vol. 26, No. 6, Nov./Dec. 2008; pp. 2103-2106.

E.P. Benis, T.J.M. Zouros; The hemispherical deflector analyser revisited II. Electron-optical properties; Journal of Electron Spectroscopy and Related Phenomena;Jan./Feb. 2008; pp. 28-39; 163.

Khursheed; Conventional SEM Design; Scanning Electron Microscope Optics and Spectrometers; Ch 1, pp. 1-69.

Anjam Khursheed, Hung Quang Hoang; A second-order focusing electrostatic toroidal electron spectrometer with 2p radian collection; Ultramicroscopy 109; Aug./Sep. 2008; pp. 104-110; Elsevier B.V.

H. Q. Hoang, A. Khursheed; Toroidal spectrometer for signal detection in scanning ion/electron microscopes; J. Vac. Sci. Technol. B 27,,6; Nov./Dec. 2009; pp. 3226-3231.

* cited by examiner

| | |
|---|---|
| $V_d$ | $-0.540E_p$ |
| $V_3$ | $-0.172E_p$ |
| $V_2$ | $-0.470E_p$ |
| $V_1$ | $-0.570E_p$ |
| $\theta$ | 33.4° |
| $\Delta\theta$ | ±6° |
| $\Delta E$ (half width) | 0.013% |

Figure 7

SEQUENTIAL RADIAL MIRROR ANALYSER

RELATED APPLICATIONS

This application relates to, claims priority from, and incorporates herein by reference, as if fully set forth, U.S. Provisional Patent Application Ser. No. 61/560,909 filed on Nov. 17, 2011 and titled "RADIAL MIRROR ELECTRON ANALYZER FOR CHARGED PARTICLES."

FIELD & BACKGROUND

The present invention relates to a sequential radial mirror analyser, particularly but, not exclusively for electron/ion microscopes.

Energy spectrometers for electron/ion microscopes are often used for analytical techniques such as Auger Electron Spectrometry (AES), Ultraviolet photoelectron spectroscopy (UPS), and X-ray Photoelectron Spectroscopy (XPS). Compact Toroidal Deflector Analyzers have also been proposed for use as add-on attachments to scanning electron microscopes, where they capture either the scattered secondary or backscattered energy spectra. However, improvements in designs of conventional energy spectrometers are desired.

In AES, the relatively high energy resolution capability of Hemispherical Deflector Analyzers (HDAs), which is around 0.05%, comes at a price of low transmission, typically at less than 0.15%. On the other hand, the better transmission performance of Cylindrical Mirror Analyzers (CMAs), being around 15% comes at a price of a poorer minimum energy resolution, which is typically between 0.2% and 0.3%. Hence, it can be appreciated that existing energy spectrometers are unable to provide both high transmittance (>15%) and high energy resolution (<0.05%). Further, existing energy spectrometers do not have the ability to perform parallel energy acquisition, in which output signals of different energies can be obtained simultaneously, greatly speeding up data-acquisition times. In this respect, while both the CMA and HDA operate sequentially, the HDA may be configured to operate in a partial parallel mode of operation for high energy resolution (>0.05%), where the output energy bandwidth is typically around 3% of the central-band energy.

As is known, the energy spectrometers in the Scanning Electron Microscope (SEM) have a variety of different applications, including quantitative voltage contrast from secondary electrons and material analysis/topography using backscattered electrons. Specifically, the possibility of carrying out Auger elemental analysis in the SEM was recently demonstrated just after cleaning a specimen's surface with an ion beam. This method is however only feasible for short data acquisition times, which in turn requires further improvements in the resolution-transmittance performance of present energy spectrometers. Moreover, it also requires widening the bandwidth in a parallel mode of operation. It will be also appreciated that energy spectrometers are needed for the Scanning Helium Ion Microscope (SHIM) for acquiring material analysis information from backscattered Helium ions.

One object of the present invention is therefore to address at least one of the problems of the prior art and/or to provide a choice that is useful in the art.

SUMMARY

According to a 1$^{st}$ aspect of the invention, there is provided a sequential radial mirror analyser (RMA) for facilitating rotationally symmetric detection of charged particles caused by a charged beam incident on a specimen. The RMA comprises a 0V equipotential exit grid, and a plurality of electrodes electrically configured to generate corresponding electrostatic fields for deflecting at least some of the charged particles of a single energy level to exit through the exit grid to form a second-order focal point on a detector. The second-order focal point is associated with the single energy level, and the detector is disposed external to the corresponding electrostatic fields.

The proposed RMA is a high resolution-transmittance electron energy analyser with good signal-to-noise characteristics, and suitably configured as an attachment for use within the specimen chambers of SEMs. Advantageously, the RMA 100 uses a rotationally symmetric electric field distribution to radially direct electrons/ions emitted from a specimen being examined onto a detector. Further, the RMA allows the specimen to be vertically positioned below and separated from a pole-piece/electrode objective lens in the RMA by only a short distance of about 5 mm or less. Moreover, the RMA has a relative energy resolution of 0.025% for an entrance angular spread of ±6°, corresponding to a transmission of better than 15%. These characteristics combine the best features of both the HDA and CMA, in terms of the high energy resolution of the HDA operating in retarding field mode (<0.05%), and the high transmittance of the CMA (around 15% transmittance). Additionally, the proposed RMA is configured with a specific output energy bandwidth and is also beneficially enabled with a partial parallel energy acquisition mode of operation in which an energy bandwidth on a conical-shaped detector is determined to be as high as 32% (±16%) of the central band energy, $E_0$, while an energy bandwidth on a flat ring-shaped detector is determined to be around 15% (±7.5%) of the central-band energy, $E_0$, over which the simulated relative energy resolution remains below 0.06% for angular spreads of ±6°. It should be noted that this partial parallel energy acquisition of the proposed RMA is quite different to that of wide-band energy analysers, such as the Hyperbolic Field Analyzer (HFA), which are designed to detect an energy range that varies by several orders of magnitude. Further, the field distribution inside the proposed RMA is designed to be optimal for single energy acquisition, and is quite different to wide-band energy analyzers such as the HFA.

Preferably, the RMA may further comprise a 0V equipotential entrance grid. In addition, the RMA may be configured to be mounted to a scanning electron/ion microscope. Preferably, the field strength of the electrostatic fields may be configured to enable deflection of the at least some of the charged particles having an in-plane angular spread of ±6° relative to adjacent charged particles of a similar energy level exiting the grid. Yet further, the entrance and exit grids may have a grid transparency of greater than 80%.

Preferably, the field strength of the electrostatic fields may be configured to achieve a relative energy resolution of better than 0.025% for an in-plane angular spread of ±6° for a majority of the energy range. More preferably, the RMA may be configured to receive the charged particles which are characterised with an entrance polar angle of approximately 32.6° via the entrance grid. Additionally, the detector may be arranged around the vertical rotational axis of the RMA to enable detection of the at least some of the charged particles omnidirectionally.

Yet preferably, the RMA may further comprise an energy selection aperture device having an aperture configured to selectively enable charged particles of a specific energy level to pass through, wherein the energy selection aperture device may be disposed external to the electrostatic fields, and arranged intermediate to the exit grid and detector. Also, the RMA may preferably be configured to receive the charged particles which are characterised with an entrance polar angle of approximately 33.4° via the entrance grid.

Preferably, the RMA may further comprise at least one guiding channel for receiving the charged particles from the energy selection aperture device, wherein the at least one guiding channel is configured to deflect the received charged particles towards the detector. Yet preferably, the at least one guiding channel may include a plurality of secondary electrodes electrically configured to generate electrostatic fields for deflecting the received charged particles. Further, the RMA may include the detector which is positioned on the vertical rotational axis of the RMA. Yet preferably, the RMA may include the detector.

According to a $2^{nd}$ aspect of the invention, there is provided a scanning electron/ion microscope comprising the RMA based on the $1^{st}$ aspect of the invention.

Preferably, the scanning electron/ion microscope may further comprise a pole-piece objective lens which is configured to be vertically spaced from the specimen by a minimum distance of 5 mm.

According to a $3^{rd}$ aspect of the invention, there is provided a method of detecting charged particles caused by an electron/ion beam incident on a specimen using the sequential RMA of the $1^{st}$ aspect of the invention. The method comprises receiving the charged particles, generating the corresponding electrostatic fields to deflect at least some of the charged particles of a single energy level to exit through the exit grid, and detecting a second-order focal point formed by the at least some of the charged particles on the detector. The second-order focal point is associated with the single energy level.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 7 is a table listing design parameters for the RMA of FIG. 6;

FIG. 8b is a closed-up view of the energy selection aperture device of FIG. 6 to depict filtering of the simulated trajectories of FIG. 8a.

DETAILED DESCRIPTION OF PREFERRED EMBODIMENTS

Figure 1:
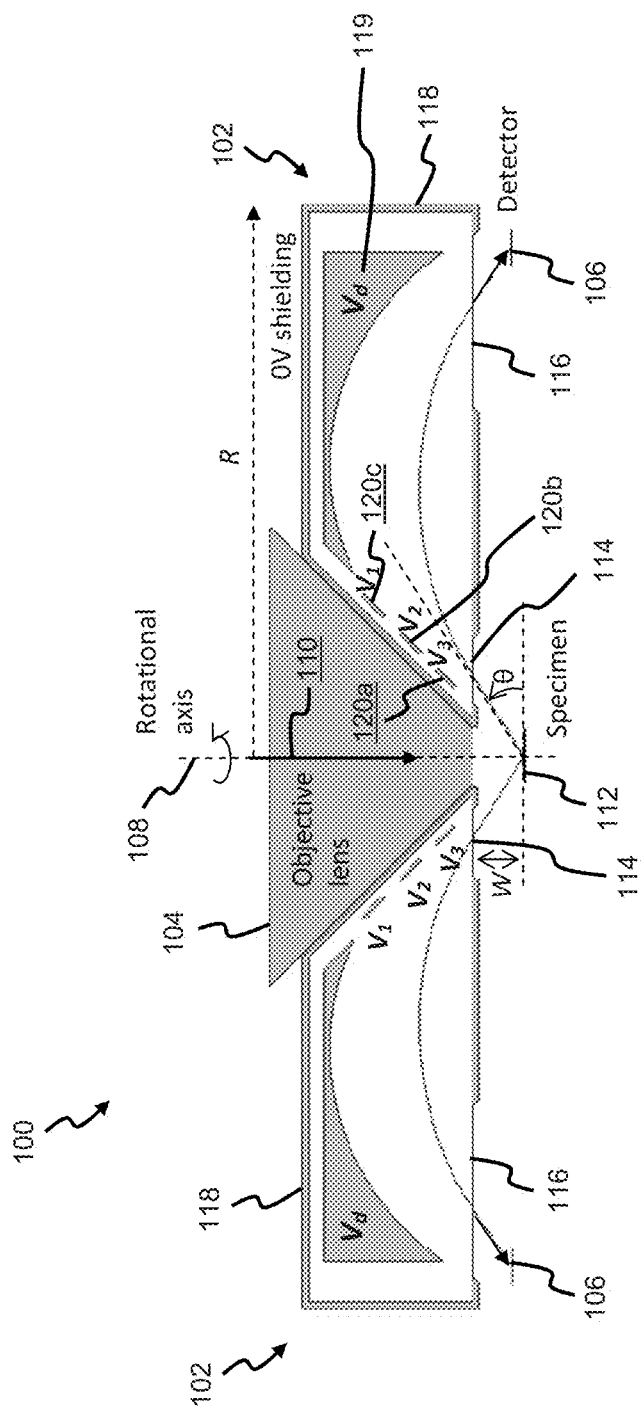
FIG. 1 is a schematic diagram of a Radial Mirror Analyser (RMA) configured for use within a SEM, according to a first embodiment of the invention.

FIG. 1 is a schematic diagram of a Radial Mirror Analyser (RMA) 100 configured for use within a Scanning Electron Microscope (SEM), according to a first embodiment of the invention. The proposed name of the RMA 100 is adopted in reference to use of an electric field to mirror and analyse the energies of electrons/ions travelling in a radial direction from a central point source. It is to be highlighted that the proposed RMA 100 is a high performance band-pass electron/ion energy analyser, which functions by capturing electrons/ions at specific pass energy, defined by electric biasing potentials on the analyser's deflector electrodes. An energy spectrum of the electrons/ions is then generated by sequentially changing the electric field strength between the analyser's deflector electrodes, thereby effectively varying the pass energy, and recording the corresponding output signal obtained. In other words, data acquisition is sequential in nature. Specifically, the RMA 100 is a second-order focusing band-pass analyser, and is different to sequential analysers such as the Hemispherical Deflector Analyzers (HDAs) or Cylindrical Mirror Analyzers (CMAs). The RMA 100 primarily includes an analyser body 102. The RMA 100 is placed around a pole-piece/electrode objective lens 104 (which comprises an upper pole-piece and a lower pole-piece), being a component of the SEM, as described below. A separate ring-shaped detector (or collector) 106 is arranged external to the analyser body 102. The analyser body 102 has a wide cylindrical-like arrangement, in which an inverted cone-like depression, with the apex of the inverted cone being truncated, is centrally formed in the analyser body 102 to accommodate the pole-piece/electrode objective lens 104. Particularly, the oblique walls of the inverted cone-like depression are angularly arranged at 45° relative to a horizontal axis of the RMA 100. In other words, the pole-piece/electrode objective lens 104 is formed to substantially follow the shape of the inverted cone-like depression.

It is importantly to appreciate that the design of the RMA 100 is guided by that of the conventional fountain spectrometer (not shown). Specifically, the RMA 100, like the fountain spectrometer, has a central vertical rotational axis of symmetry 108 about the pole-piece/electrode objective lens 104, but unlike the fountain spectrometer, the proposed RMA 100 provides a central conical shaped field free region (through the inverted cone-like depression), in which the pole-piece/electrode objective lens 104 is fitted, as afore described. It will also be apparent that the central rotational axis of symmetry 108 of the RMA 100 is the longitudinal axis of rotation of the analyser body 102. The RMA 100 thus advantageously overcomes a problem relating to use of the fountain spectrometer within the SEM wherein there is no central hole through which a primary electron/ion beam (hereinafter primary beam) 110 can be introduced to be directed at a specimen being examined, as the provision of such a central hole in the fountain spectrometer will inevitably change its internal field distribution and alter the energy dispersion and focusing properties of the fountain spectrometer.

When the RMA 100 is used for specimen investigation, the primary beam 110 is passed through the pole-piece/electrode objective lens 104 to be directed at and incident on a specimen 112 being examined. The specimen 112 is positioned on a horizontal plane, conveniently located below the pole-piece/electrode objective lens 104 and external to the analyser body 102 (i.e. see FIG. 1). It is to be noted that this positioning of the specimen 112 below the analyser body 102 is similar to that of the conventional backscattered detector (not shown). Furthermore, the specimen 112 is arranged to be vertically separated from the pole-piece/electrode objective lens 104 by a minimum working distance, "W", which is of the same dimension as the radius of the lower pole-piece of the pole-piece/electrode objective lens 104. Particularly, the minimum working distance "W" is vertically measured from the lowest point of the pole-piece/electrode objective lens 104, when being arranged within the RMA 100, to the specimen 112. It will be appreciated to skilled persons that the lower pole-piece of the pole-piece/electrode objective lens 104, together with the upper pole-piece, confines the magnetic field of the primary beam 110 to be within a small air-gap region through which the primary beam 110 travels. The pole-piece/electrode objective lens 104 is conically shaped, with a minimum radius at its lower end, so that the specimen 112 can be arranged to be tilted, if desired for working purposes.

More specifically, the minimum working distance, "W", is configured to be as small as 5 mm, allowing for high spatial resolution. It is to be appreciated that in a SEM, the minimum working distance "W" usually ranges between, 5 mm and 30 mm, where high resolution of the electron probe (i.e. corresponding to the smallest spot diameter) requires smaller minimum working distances. Thus, the proposed RMA 100 is configured to allow the minimum working distances to be decreased to be around 5 mm, which consequently allows SEMs, which use the proposed RMA 100 as an attachment, to function in the high resolution mode.

Further, the RMA 100 is configured to deploy a rotationally symmetric electric field distribution to transport electron/ion rays emitted from a central point source of the specimen 112, after being struck by the primary beam 110, in a radial direction onto the ring-shaped detector 106. It is to be noted that the horizontal plane of the ring-shaped detector 106 is known as the Gaussian focal plane, and the energy bandwidth thereat is approximately $\pm 10\% E_0$. More specifically, the emitted electron/ion rays enter the analyser body 102 through an entrance electrostatic grid 114 which is located at the base of the analyser body 102 and in the vicinity of, and substantially proximal to, the 45° oblique walls of the analyser body 102. Thereafter, the emitted electron/ion rays having travelled through the analyser body 102 subsequently exits via an exit electrostatic grid 116 which is also located at the base of the analyser body 102 but at an opposing end from the entrance electrostatic grid 114. It is to be appreciated that in this embodiment, the grid transparency of both the entrance and exit electrostatic grids 114, 116 is configured to be higher than 80%.

Particularly, in this arrangement, the ring-shaped detector 106 is positioned below the exit electrostatic grid 116 and external to the analyser body 102. The entrance and exit electrostatic grids 114, 116 are both grounded at 0V to avoid distortion of the electric field distribution within the RMA 100 near these regions. In this embodiment, for sake of simplicity, the entrance and exit electrostatic grids 114, 116 are approximated to be ideal equipotential planes. It will also be apparent that the entrance and exit electrostatic grids 114, 116, from a top plan view of the analyser body 102 in terms of looking down on the analyser body 102 in the direction of the primary beam 110 as directed, respectively form two circular slots on the base of the analyser body 102 encircling the truncated apex of the inverted cone-like depression, the entrance electrostatic grid 114 being an inner circular slot (with a smaller radius) while the exit electrostatic grid 116 is an outer circular slot (with a larger radius).

The analyser body 102, with its wide cylindrical-like arrangement, has a spectrometer radius, "R", of approximately 5 cm. This spectrometer radius, "R", is measured from the central rotational axis of symmetry 108 of the RMA 100 to the outer vertical periphery of the analyser body 102. The body cover 118 of the analyser body 102 is grounded at 0V to prevent electric field leakage into a specimen chamber (not shown) of the SEM. It will be apparent, from FIG. 1, that the analyser body 102 houses an upper deflection electrode 119 and a set of three conical entrance deflection electrodes 120a, 120b, 120c, which are collectively used for generating corresponding electrostatic fields to focus the electron/ion rays onto the ring-shaped detector 106. The upper deflection electrode 119, which is biased at a voltage of $V_d$, is arranged to be attached to an upper inner surface of the body cover 118 of the analyser body 102, the upper inner surface facing directly opposite to the base of the analyser body 102. In addition, the upper deflection electrode 119 has a surface portion, which faces the entrance and exit electrostatic grids 114, 116, that is substantially parabolic-like with a certain predetermined degree of curvature. On the other hand, the set of entrance deflection electrodes 120a, 120b, 120c are segmented from one another, and arranged to be serially arranged and attached to the 45° oblique walls of the analyser body 102. Further in this arrangement, the set of entrance deflection electrodes 120a, 120b, 120c are positioned near to the entrance electrostatic grid 114. The entrance deflection electrodes 120a, 120b, 120c are respectively configured to be at corresponding biasing potentials of $V_1$, $V_2$, and $V_3$, for the generation of electrostatic field within the analyser body 102 to control the focal point positions of the electron/ion rays of different energies onto the ring-shaped detector 106. More specifically, the corresponding potentials of $V_1$, $V_2$, and $V_3$ are adjusted appropriately in order that the RMA 100 is able to provide an optimal mirroring/focusing action on any electron/ion rays that are directed into the analyser body 102 through the entrance electrostatic grid 114.

It is to be highlighted that, in this embodiment, various designs were investigated for the RMA 100 in terms of varying the shape of the upper deflection electrode 119, relative positions of the set of entrance deflection electrodes 120a, 120b, 120c, different values of the biasing potentials $V_1$, $V_2$, and $V_3$, to used, and an entrance polar angle, "θ", in order to minimize the simulated energy resolution at the plane of the detector 104. The entrance polar angle, "θ", is defined to be a take-off angle of the electron/ions rays emitted from the specimen 112, with respect to the horizontal plane of the specimen 112. In this instance, the design parameters that are found to be optimal for producing the best simulated energy resolution (half-width), being at 0.025%, are as follow: the entrance polar angle θ is 32.6°, $V_d = -0.571 E_P$, $V_1 = -0.571 E_P$, $V_2 = -0.470 E_P$, $V_3 = -0.172 E_P$, with $E_P$ being defined as a pass energy to be analysed by the RMA 100. It would be appreciated that the pass energy is selected and defined by a user.

Figure 2:
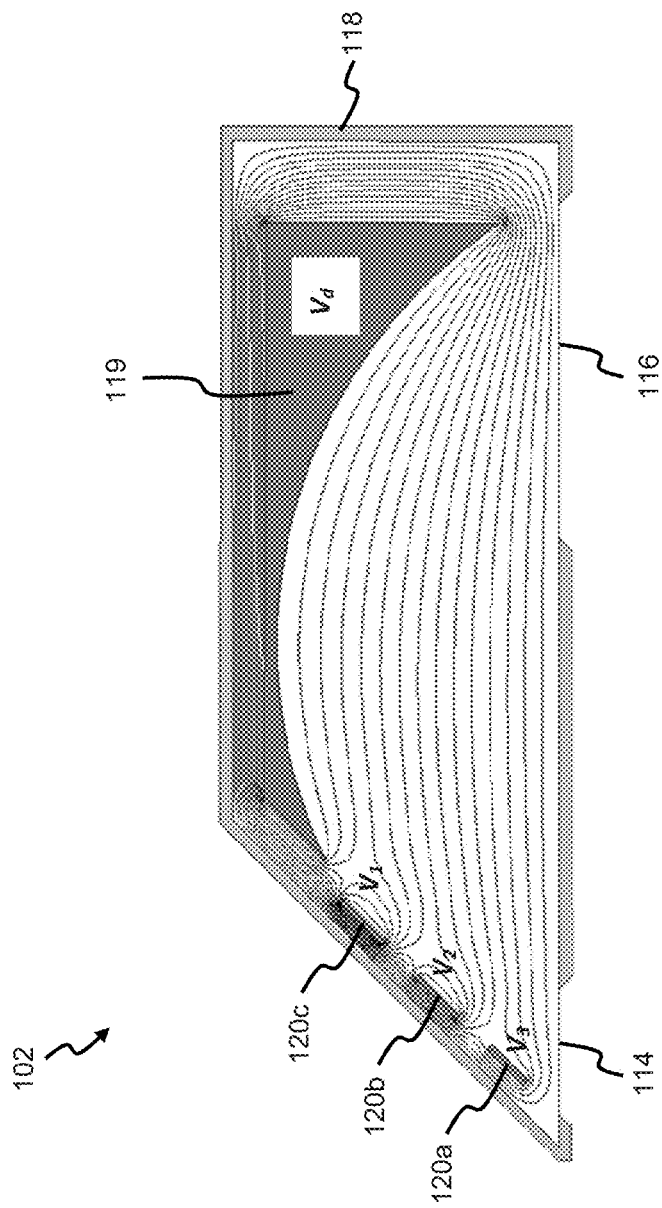
FIG. 2 shows a diagram depicting equipotential lines from a numerically solved field distribution for the RMA of FIG. 1.

FIG. 2 depicts equipotential lines from a numerically solved field distribution for the RMA 100, in which fourteen equipotential lines are plotted at uniform voltage steps of between 0V to $0.571 E_P$ on the simulated potential distribution for the afore mentioned design parameters. In particular, the voltage of the upper deflection electrode 119 is chosen to be $V_d = -0.571 E_P$, with the rest of the design parameters taking on the optimal values as afore mentioned. It will also be apparent, based on visual inspection of FIG. 2, that the equipotential lines generated within the RMA 100, especially those close to the set of entrance deflection electrodes 120a, 120b, 120c, are not uniform, similar to the conventional fountain spectrometer. In respect of this observation, it will be appreciated that this non-uniform field distribution near the entrance electrostatic grid 114 of the analyser body 102 is a critical design parameter that enables the proposed analyser body 102 to achieve high energy resolution. Yet furthermore, the non-uniform field distribution created by the curvature of the upper deflection electrode 119 close to the exit electrostatic grid 116 of the analyser body 102 is also another important design parameter to enable parallel energy acquisition capability for the RMA 100.

Figure 3:
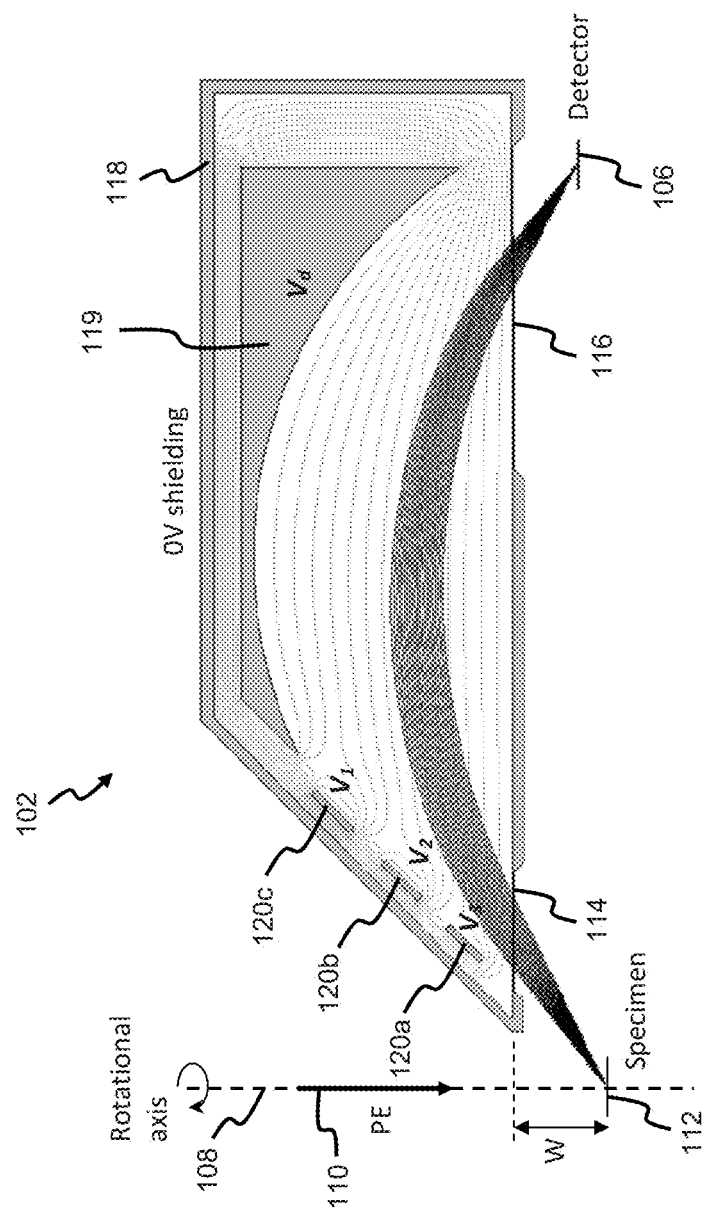
FIG. 3 depicts simulated paths of electron/ion rays through the RMA of FIG. 1 at a pass energy, $E_p$, for a wide variety of entrance angles.

With reference to the simulated energy resolution-transmittance characteristics of the RMA 100, FIG. 3 depicts simulated trajectories of twenty-one electron/ion rays through the proposed RMA 100 at the pass energy, "$E_p$" of 1 eV, for a wide variety of entrance polar angles. In particular, a central electron/ion ray among the simulated electron/ion rays, as shown, enters the analyser body 102 at an entrance polar angle, "θ", of 32.6°, while the remaining electron/ion rays are relatively varied between an input angular spreads of ±6°. It should be mentioned that the remaining electron/ion rays are of the same energy as the central electron/ion ray. It is to be appreciated that the value of the entrance polar angle adopted in this instance is different to that of the conventional (second-order focusing) fountain spectrometer, where "θ" is instead defined to be 30°.

Figure 4A:
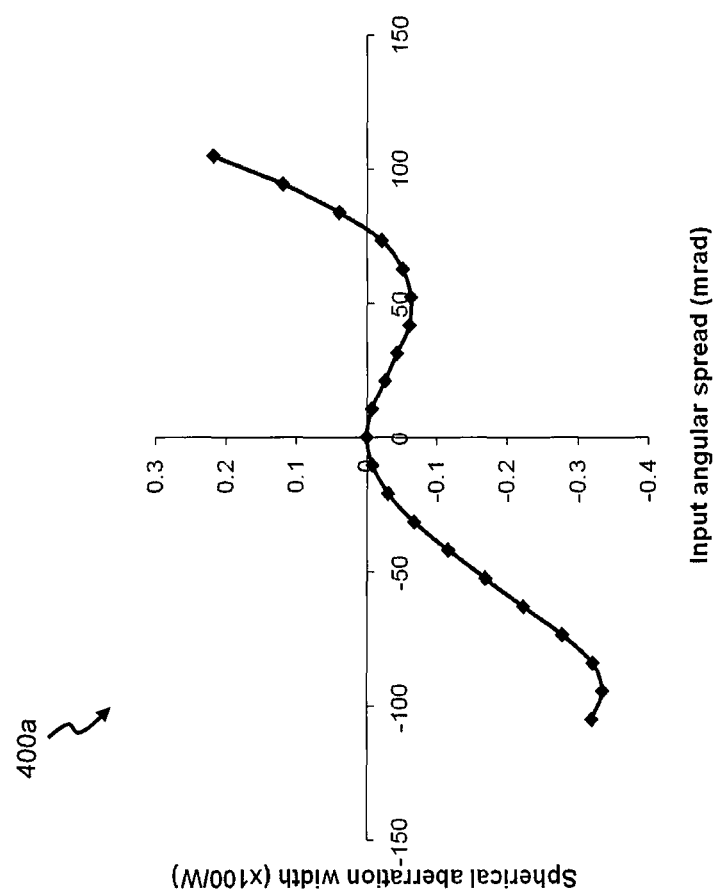
FIGS. 4a and 4b show plots depicting simulated normalized trace-width at the output focal plane of the RMA of FIG. 1, the trace-width being plotted as a function of spherical aberration, and relative energy spread respectively.
Figure 4B:
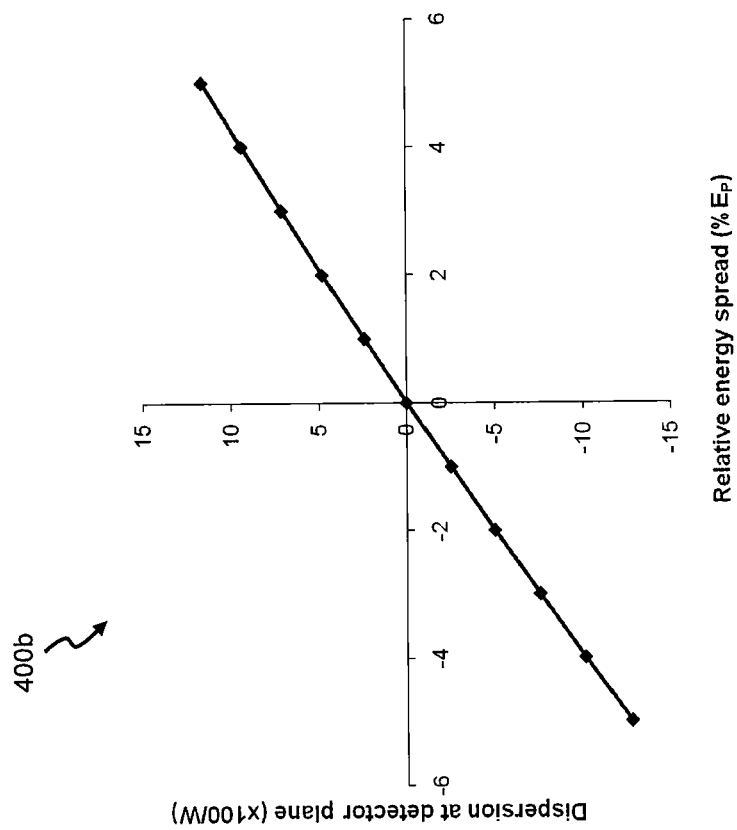

Further, the spherical aberration characteristics of the RMA 100 is obtained by monitoring the beam trace-width at the Gaussian focal plane of the ring-shaped detector 106 to be a function of the input angular spreads (i.e. ±6°) and consequently, the (normalized) results obtained are illustrated in a corresponding plot 400a of FIG. 4a. Indeed, this plot 400a indicates that the design of the proposed RMA 100 is characterised by second-order focusing properties, since the trace-width at the Gaussian focal plane exhibits third-order dependence with respect to the defined input angular spreads of ±6°. In other words, the proposed RMA 100 is a second-order focusing analyser. It is however to be appreciated that occurrence of the third-order dependence is, slightly asymmetric, likely due to the presence of non-uniform field distribution regions, such as those formed in the vicinity of the set of entrance deflection electrodes 120a, 120b, 120c, and below the upper deflection electrode 119 around the exit electrostatic grid 116. On the other hand, FIG. 4b depicts another plot 400b which shows the energy dispersion at the Gaussian focal plane caused by the relative energy spread in the emitted electron/ion rays, and in accordance with theoretical predictions, the relationship between energy dispersion and relative energy spread, in this instance, varies linearly.

The energy resolution of the RMA 100 is related to the trace-width created by the spherical aberration, compared to the dispersion along the Gaussian focal plane caused by the relative energy spread. Specifically in this embodiment, the energy resolution of the RMA 100 is calculated from half of the full (base) trace-width. For the input angular spreads of ±6°, the energy resolution at the Gaussian focal plane is determined via theoretical predictions to be about 0.11%. Additionally, the transmittance for the defined angular spreads of ±6° is around 20%, assuming a condition of 2π collection (i.e. 360°) of the emitted electron/ion rays on the Gaussian focal plane in the azimuthal direction, and a polar angle cosine distribution of the emitted electron/ion rays, (i.e. the number of electrons emerging from the specimen 112 is proportional to the cosine of the polar angle). It is to be highlighted that in practice, depending on the transparency of the entrance and exit electrostatic grids 114, 116, this transmittance can be reduced to only around 15%.

Figure 5:
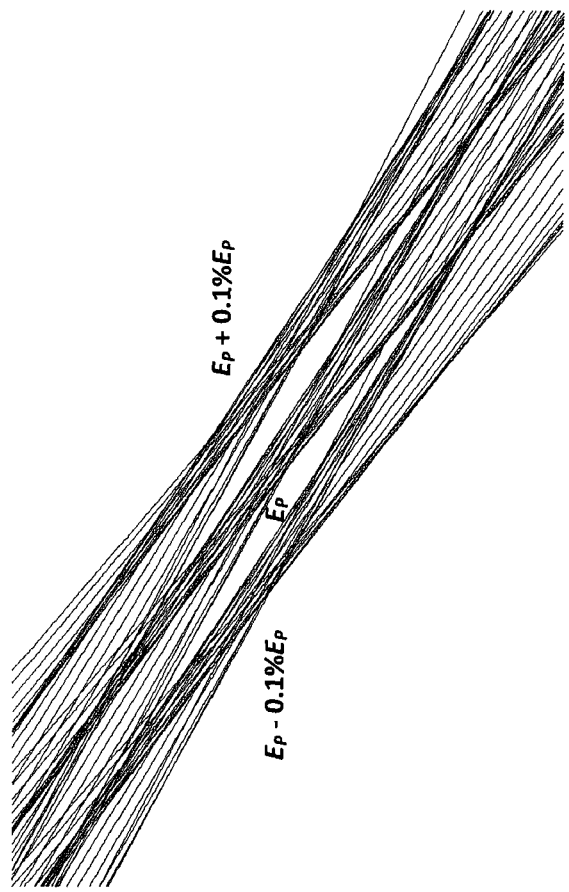
FIG. 5 depicts simulated trajectories around the output focal plane of the RMA of FIG. 1 for three emission energies: $E_P$–0.1% $E_P$, $E_P$, and $E_P$+0.1% $E_P$.

Also, a property of second-order focusing analysers is that the best energy resolution lies not at the Gaussian focal plane, but at a little distance preceding the Gaussian focal plane. For the design of the proposed RMA 100, the optimal simulated relative energy resolution is determined to be around 0.025% for the input angular spreads of ±6°, which is approximately a factor of four times better than the Gaussian plane value. This high energy resolution performance is graphically depicted in a diagram 500 of FIG. 5, which shows simulated trajectories of the emitted electron/ion rays around the Gaussian focal plane of the RMA 100 for three emission energies: $E_P$–0.1% $E_P$, $E_P$, and $E_P$+0.1% $E_P$, where "$E_P$" is the pass energy. More particular, FIG. 5 shows that the electron/ion rays at the Gaussian focal plane for these emission energies are well separated and confirms that the optimal simulated relative energy resolution is around 0.025%. Indeed, this predicted energy resolution is around an order of magnitude better than that of the CMA for the same entrance angular spread, and is comparable to that of the HDA operating in the retarding mode.

Further embodiments of the invention will be described hereinafter. For the sake of brevity, description of like elements, functionalities and operations that are common between the embodiments are not repeated; reference will instead be made to similar parts of the relevant embodiment(s).

Figure 6:
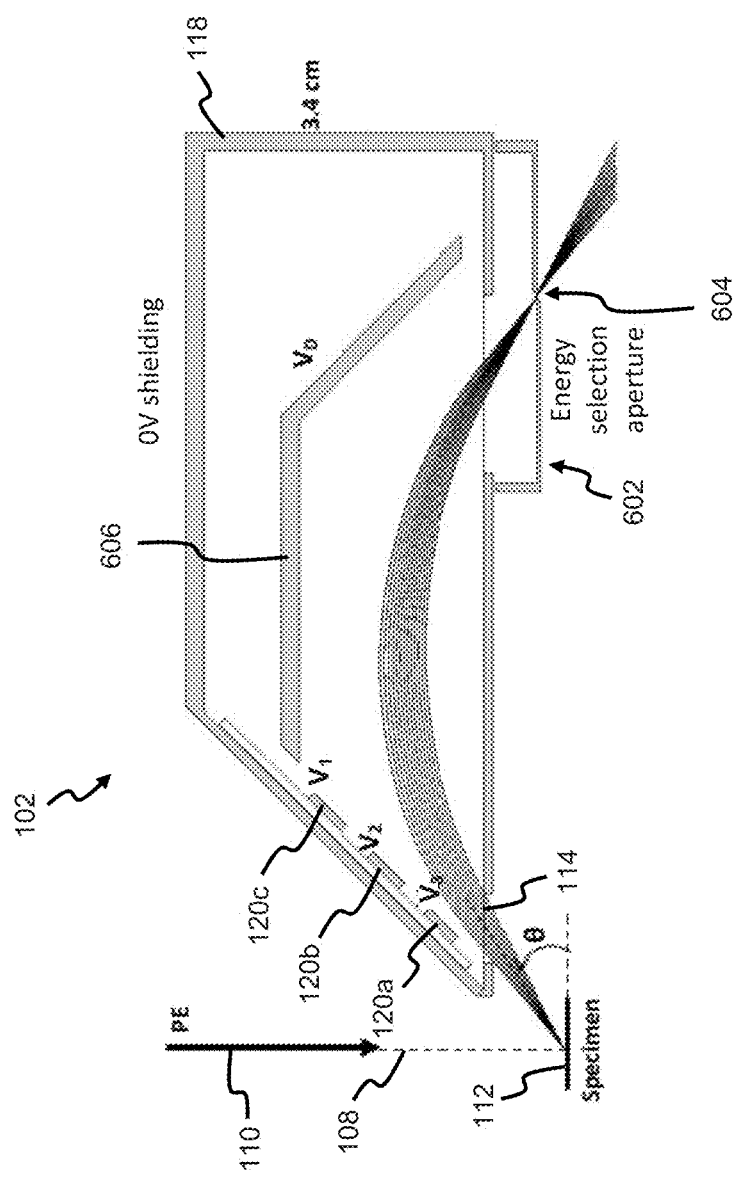
FIG. 6 is a schematic diagram of a Radial Mirror Analyser (RMA) which includes an energy selection aperture device, according to a second embodiment.

According to a second embodiment, FIG. 6 shows the RMA 100 of the first embodiment but further includes an energy selection aperture device 602 that has an energy selection aperture 604 at its base. In addition, the upper deflection electrode 119, which has a curved configuration in the first embodiment has been replaced with another upper deflection electrode 606, which is of a two part segmented design, being considerable easier to manufacture. In particular, the energy selection aperture device 602 is arranged to be external to the analyser body 102, and attached adjacent to the exit electrostatic grid 116. More particularly, the energy selection aperture device 602 is configured as a holder for carrying the energy selection aperture 604. Importantly, the energy selection aperture device 602 desirably enables filtering of emitted electron/ion rays exiting from the analyser body 102, based on their specific energies. Hence, it is also to be appreciated that the ring-shaped detector 106 (of the first embodiment) is then located underneath the energy selection aperture device 602, in a proximal arrangement to the energy selection aperture 604, to collect the emitted electron/ion rays after they have passed through the energy selection aperture 604 for facilitating detection of an electron/ion ray of a specific energy. In this instance, the following design parameters are adopted for the RMA 100 of the second embodiment to achieve an energy resolution (half-width) of 0.013%: the entrance polar angle "θ" is defined at approximately 33.4° (with an input angular spreads of ±6°), $V_1$=–0.570$E_P$, $V_2$=–0.470$E_P$, $V_3$=–0.172$E_P$, and $V_d$=–0.540$E_P$, and likewise, $E_p$ is the pass energy to be analysed and is set by the user.

Accordingly, the above mentioned design parameters are also shown in a table 700 in FIG. 7 for easy referencing. It will be appreciated that in comparing this set of design parameters to those afore listed for the first embodiment, small adjustments in the entrance polar angle and the biasing potentials of the upper deflection electrode 606 and entrance deflection electrodes 120a, 120b, 120c are made to accommodate the change in geometry of the upper deflection electrode 606. It is to be further highlighted that this set of design parameters allows the RMA 100 to achieve a slightly improved simulated energy distribution.

Figure 8A:
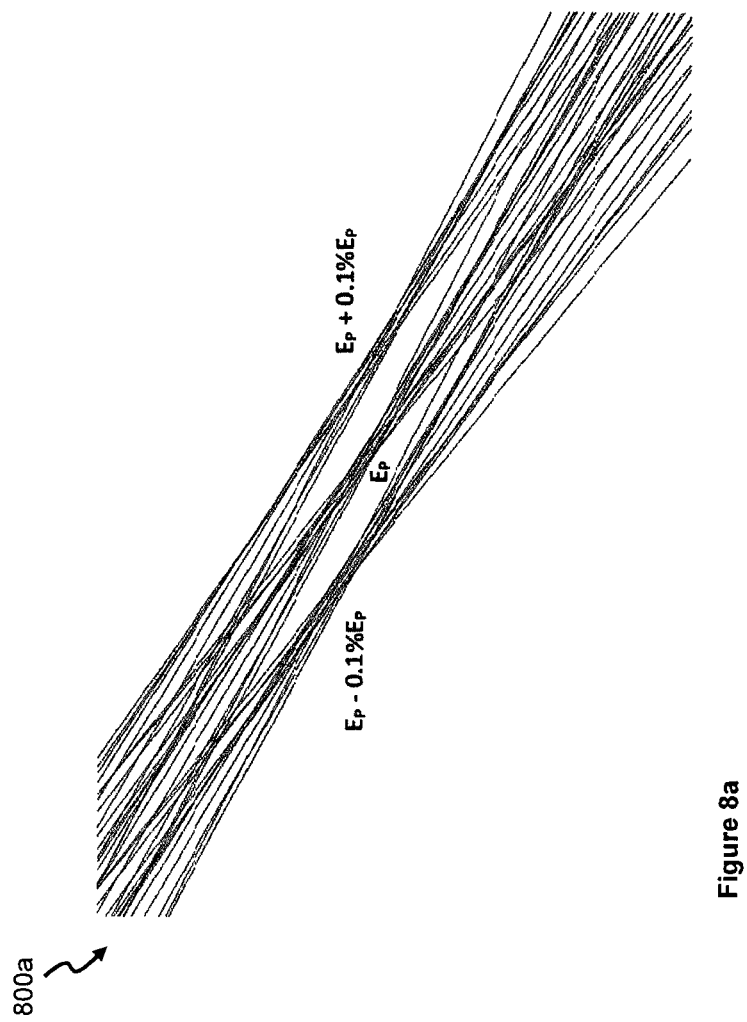
FIG. 8a depicts simulated trajectories around the output focal plane of the RMA of FIG. 6 for three emission energies: $E_P$–0.1% $E_P$, $E_P$, and $E_P$+0.1% $E_P$.
Figure 8B:
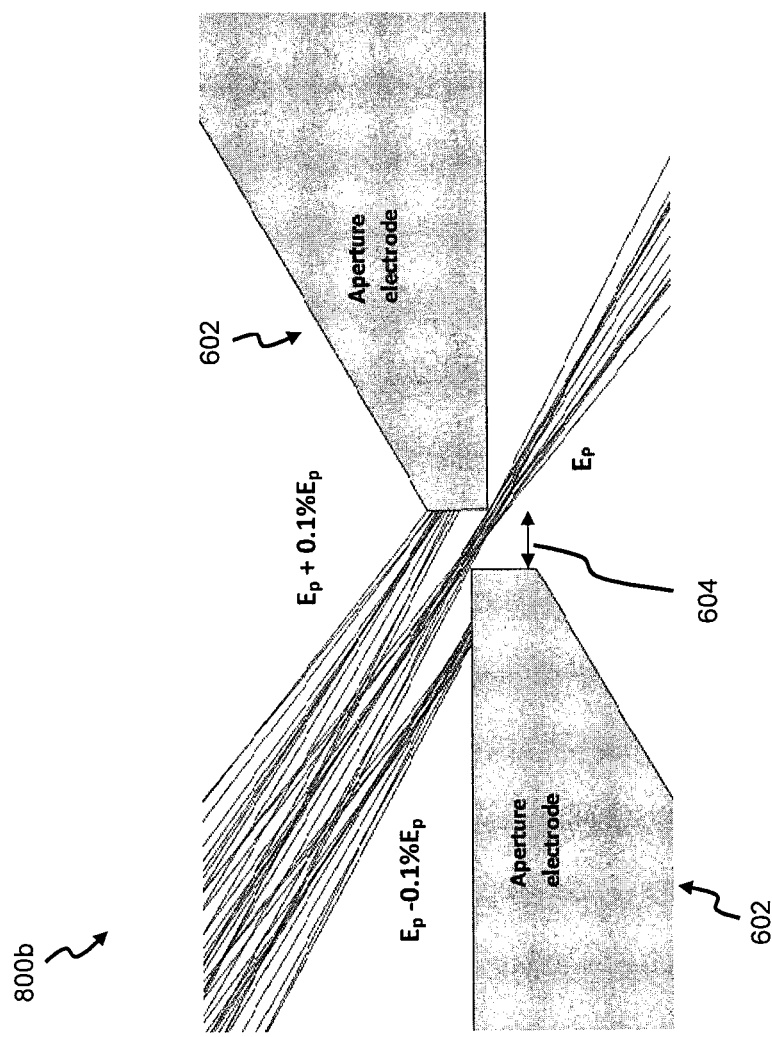

FIG. 8a shows a diagram 800a of simulated trajectories around the Gaussian focal plane of the RMA 100 of this present embodiment for three emission energies: $E_P$–0.1% $E_P$, $E_P$, and $E_P$+0.1% $E_P$, where "$E_P$" is the pass energy. More particular, FIG. 8a shows that the electron/ion rays at the Gaussian focal plane for these emission energies are well separated. FIG. 8b is a closed-up view 800b of the energy selection device 602 at the Gaussian focal plane of the RMA 100 to depict the simulated trajectories of FIG. 8a being filtered by the energy selection aperture device 602.

Figure 9:
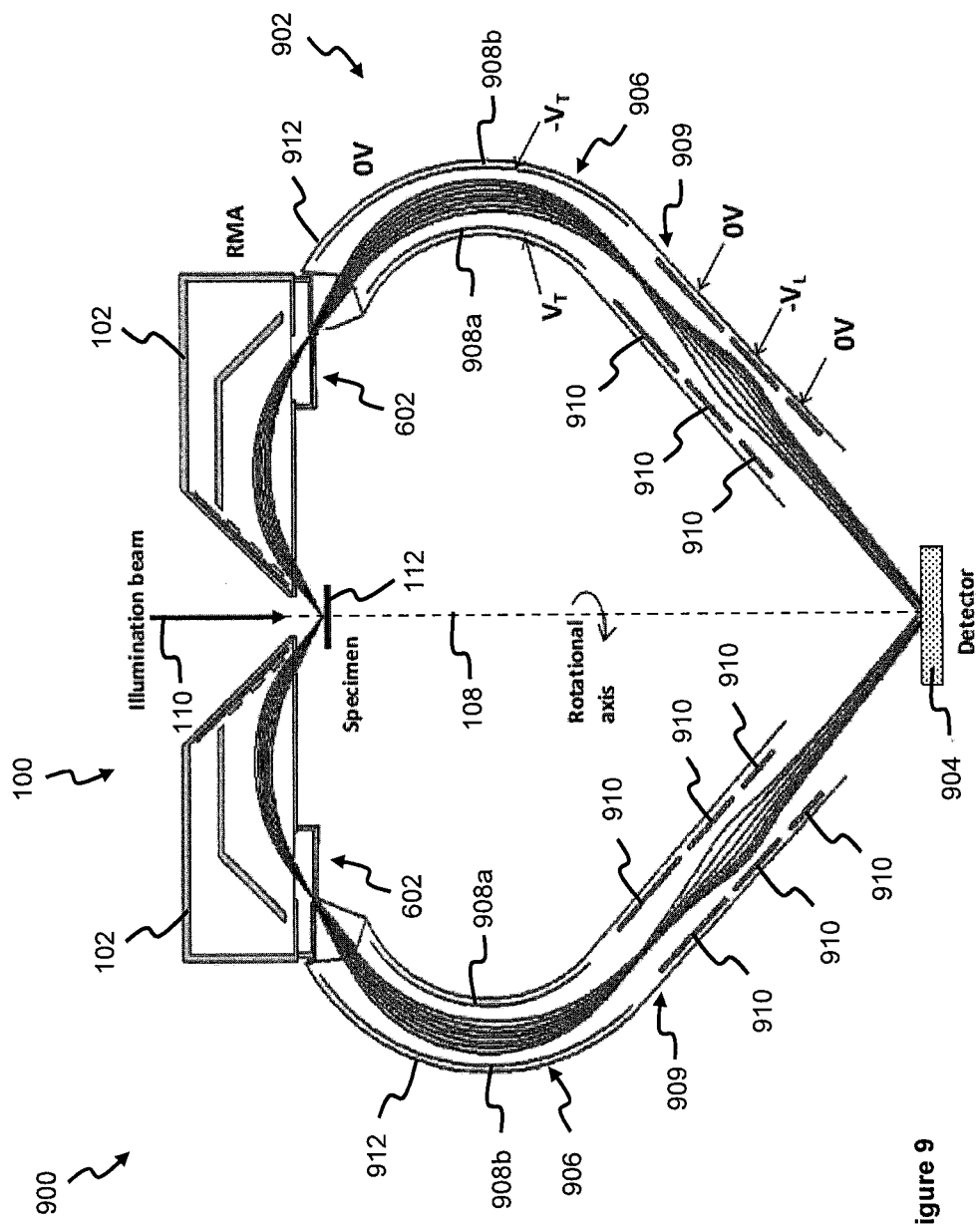
FIG. 9 is a schematic diagram of a Radial Mirror Analyser (RMA) of FIG. 6, further including a toroidal guiding device for focusing the electron trajectories to a detector, according to a third embodiment.

According to a third embodiment, FIG. 9 is an analyser setup 900 which includes the RMA 100 of FIG. 6, and additionally, a post-analyzer deflector device 902 for directing and focusing the trajectories of electron/ion rays exiting from the energy selection aperture device 602 to a single disc detector 904. It is to be appreciated that the disc detector 904 is arranged at a position below the specimen 112, which lies on the central vertical rotational axis of symmetry 108 of the RMA 100. The use of the simply configured disc detector 904 is advantageously in contrast to the relatively more complex ring-shaped detector 106 deployed in the first embodiment. The post-analyzer deflector device 902 particularly includes guiding channels (or plates) 906 that are individually attached at one end to the respective energy selection aperture devices 602 to receive the electron/ion rays exiting from the corresponding energy selection apertures 604, and to guide them towards the disc detector 904. It is also to be highlighted that, in this embodiment, the post-analyzer deflector device 902 is required to be used in conjunction together with the energy selection aperture device 602 for guiding/deflecting the electron/ion rays onto the disc detector 904. That is, the post-analyzer deflector device 902 is a guiding channel for guiding the electron/ion rays exiting from the energy selection aperture device 602 towards the disc detector 904. Particularly, the disc detector 904 is positioned at a distal end of each guiding channel 906, which is opposite to the end of the guiding channel 906 attached to the energy selection aperture device 602. Further, since the post-analyzer deflector device 902 is physically arranged to receive the electron/ion rays that have subsequently exited from the corresponding energy selection aperture device 602, the post-analyzer deflector device 902 thus does not degrade the energy resolution of the RMA 100 and is only used for the convenience of simplifying the detector geometry.

The post-analyzer deflector device 902 deflects the electron/ion rays exiting from the respective energy selection aperture devices 602 onto the disc detector 904, by first directing the exiting electron/ion rays through a toroidal section 906 that is arranged with a pair of curved deflector electrodes 908a, 908b on opposite inner surfaces of the toroidal section 906. In particular, the pair of curved deflector electrodes 908a, 908b are biased at $V_T$ and $-V_T$ respectively, in which $V_T$=0.35$E_P$, to generate electric fields for deflecting the direction of the electron/ion rays so that they move towards, instead of away from, the central rotational axis of symmetry 108 of the RMA 100. Thereafter, the deflected electron/ion rays travel down from the toroidal section 906 to an "electric lens" section 909 of the post-analyzer deflector device 902, which is arranged with a series of deflector electrodes 910 acting as electric lens to focus the deflected electron/ion rays onto the disc detector 904. For this purpose, it is thus apparent that the deflector electrodes 910 are arranged closer at the opening end of the post-analyzer deflector device 902 leading to the disc detector 904. Each of the deflector electrodes is biased at 0V, except for the middle deflector electrodes in the series which are instead biased at $-V_L$, in which $V_L$=0.64$E_P$ (with $E_p$ being the pass energy to be analysed) It is also to be highlighted that the body cover 912 of the post-analyzer deflector device 902 is grounded at 0V to prevent leakage of the electric field.

In summary, the proposed RMA 100 is a high resolution-transmittance electron energy analyser with good signal-to-noise characteristics, and suitable for use as an attachment inside the specimen chambers of SEMs, unlike the CMA and HDA. The RMA 100 also adopts a rotationally symmetric electric field distribution to direct electrons/ions emitted from a central point source on the specimen 112 in a radial direction onto the ring-shaped detector 106 to capture a high proportion of the emitted electrons/ions. The analyser body 102 of the RMA 100 is also advantageously arranged to accommodate the conical shaped pole-piece/electrode objective lens 104, which enables the pole-piece/electrode objective lens 104 and the specimen 112 to be vertically separated by a relatively short minimum working distance of about 5 mm or less, which is much shorter compared to existing electric band-pass spectrometers attachments. Moreover, simulation results for the proposed RMA 100 have shown that it is characterised by a relative energy resolution of (better than) 0.025% for an entrance angular spread of ±6°, which importantly corresponds to a transmission of better than 15%. Notably this is around an order of magnitude better than the CMA for the same range of entrance angular spread. Thus, these characteristics combine the best features of both the HDA and CMA, in terms of the high energy resolution of the HDA operating in retarding field mode (<0.05%), and the high transmittance of the CMA (around 15% transmittance).

Furthermore, if the RMA 100 is deployed together with the energy selection aperture device 602, and post-analyzer deflector device 902, the entire setup advantageously enables a simple disc detector 904 to be used as opposed to a relatively more complex ring-shaped collector/detector, which thus greatly streamlines operation and related maintenance, as it will be apparent to skilled persons.

Further, it is to be appreciated that two methods are disclosed for detecting the emitted electrons/ions exiting the proposed RMA 100. A first method is by using the ring-shaped detector 106 which is positioned just below the exit electrostatic grid 116, or as a series of detectors placed in the form of an array in the azimuthal direction. This first method of detection is suitable in instances where the RMA 100 is to be used as an attachment, since this can be accomplished in a relatively compact way. On the other hand, according to a second method, the exiting electrons/ions can be deflected back on to a single detector positioned on the vertical rotational axis 108 of the RMA 100 by using the post-analyzer deflector device 902 shown in FIG. 9. Since the energy resolution of the proposed RMA 100 is determined by the exit electrostatic aperture 116, the post-analyzer deflector device 902 will therefore not alter change the energy resolution of the RMA 100; instead, the post-analyzer deflector device 902 is only one of the many possible ways to conveniently use detectors that are already readily available, such as the single on-axis disc detector 904 which is similar to one used in the CMA.

It is also to be highlighted that the approach taken in the design of the proposed RMA 100 is primarily via simulations, where all electric field distributions and trajectories of the emitted electron/ion rays are simulated using the Lorentz-2EM™ program (although other equivalently similar software are usable as well). A $5^{th}$ order Runge-Kutta method variable step method is then used for direct ray tracing of the trajectories of the charged particles, where the trajectory step is adjusted according to the local truncation error. The accuracy of all simulations performed were continually checked by repeating all obtained results with smaller boundary segments and trajectory step sizes, ensuring that important ray tracing parameters, such as the final focal spot-size of the electron beam at the exit electrostatic grid 116 did not change significantly, by less than 1%.

The described embodiments should not however be construed as limitative. For example, the RMA 100 may be formed as an integral component within the SEM, rather than configured as an independent add-on attachment. Further, instead of the post-analyzer deflector device 902 as described in the third embodiment, any other type of equivalent guiding devices of different shapes, which nonetheless are able to provide the same functional purpose may also be utilised. Moreover, the design of the proposed RMA 100 may encompass variations in the geometry of and voltages applied to the upper deflection electrode 119 and the entrance deflection electrodes 120a, 120b, 120c electrodes, as well as the entrance polar angle of the electron/ion rays receivable by the RMA 100 via the entrance electrostatic grid 114. It is also to be appreciated that the RMA 100 may further include in its configuration, the ring-shaped detector 106, the curved detector 600 or the disc detector 904.

Yet further, another set of design parameters may be used for the RMA 100 of the second embodiment to achieve an energy resolution (half-width) of 0.016%: the entrance polar angle "θ" is defined at 32.4° (with an input angular spreads of ±6°), $V_1=-0.57000E_P$, $V_2=-0.46961E_P$, $V_3=-0.17254E_P$, and $V_d=-0.5401E_P$. Alternatively, another different set of design parameters that may be used to achieve an energy resolution (half-width) of 0.014% are: the entrance polar angle "θ" is defined at 34.4° (with an input angular spreads of ±6°), $V_1=-0.5699E_P$, $V_2=-0.4699E_P$, $V_3=-0.1742E_P$, and $V_d=-0.5396E_P$. Indeed, variations to the design may be made depending on applications.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

What is claimed is:

1. A sequential radial mirror analyser (RMA) for facilitating rotationally symmetric detection of charged particles caused by a charged beam incident on a specimen, the RMA comprising:
   a 0V equipotential exit grid; and
   more than two electrodes electrically configured with different biasing potentials to generate corresponding electrostatic fields for deflecting at least some of the charged particles of a single energy level to exit through the exit grid to form a second-order focal point on a detector, the more than two electrodes being collectively arranged to progressively apply a non-uniform retarding field formed by the generated electrostatic fields to slow down and deflect the at least some of the charged particles towards the exit grid,
   wherein the second-order focal point is associated with the single energy level, and the detector is disposed external to the corresponding electrostatic fields.

2. The RMA of claim 1, further comprising a 0V equipotential entrance grid.

3. The RMA of claim 1, configured to be mounted to a scanning electron/ion microscope.

4. The RMA of claim 1, wherein the field strength of the electrostatic fields are configured to enable deflection of the at least some of the charged particles having an in-plane angular spread of ±6° relative to adjacent charged particles of a similar energy level exiting the grid.

5. The RMA of claim 1, wherein the field strength of the electrostatic fields are configured to achieve a relative energy resolution of better than 0.025% for an in-plane angular spread of ±6° for a majority of the energy range.

6. The RMA of claim 1, wherein the detector is arranged around the vertical rotational axis of the RMA to enable detection of the at least some of the charged particles omni-directionally.

7. The RMA of claim 1, wherein the RMA includes the detector.

8. The RMA of claim 2, wherein the entrance and exit grids have a grid transparency of greater than 80%.

9. The RMA of claim 2, configured to receive the charged particles which are characterised with an entrance polar angle of approximately 32.6° via the entrance grid.

10. The RMA of claim 2, further comprising an energy selection aperture device having an aperture configured to selectively enable charged particles of a specific energy level to pass through,
    wherein the energy selection aperture device is disposed external to the electrostatic fields, and arranged intermediate to the exit grid and detector.

11. The RMA of claim 10, configured to receive the charged particles which are characterised with an entrance polar angle of approximately 33.4° via the entrance grid.

12. The RMA of claim 11, further comprising at least one guiding channel for receiving the charged particles from the energy selection aperture device,
    wherein the at least one guiding channel is configured to deflect the received charged particles towards the detector.

13. The RMA of claim 12, wherein the at least one guiding channel includes a plurality of secondary electrodes electrically configured to generate electrostatic fields for deflecting the received charged particles.

14. The RMA of claim 12, wherein the RMA includes the detector which is positioned on the vertical rotational axis of the RMA.

15. A scanning electron/ion microscope comprising the RMA of claim 1.

16. The scanning electron/ion microscope of claim 15, further comprising a pole-piece objective lens which is configured to be vertically spaced from the specimen by a minimum distance of 5 mm.

17. A method of detecting charged particles caused by an electron/ion beam incident on a specimen using the sequential RMA of claim 1, the method comprises:
    receiving the charged particles;
    generating the corresponding electrostatic fields to deflect at least some of the charged particles of a single energy level to exit through the exit grid; and
    detecting a second-order focal point formed by the at least some of the charged particles on the detector,
    wherein the second-order focal point is associated with the single energy level, and wherein the generated electrostatic fields form a non-uniform retarding field to slow down and deflect the at least some of the charged particles towards the exit grid.

* * * * *